(12) United States Patent
Wollesen (10) Patent No.: US 6,515,344 B1
(45) Date of Patent: Feb. 4, 2003

(54) THIN OXIDE ANTI-FUSE (75) Inventor: Donald L. Wollesen, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/698,485

(22) Filed: Oct. 30, 2000

Related U.S. Application Data (60) Provisional application No. 60/161,910, filed on Oct. 28, 1999.

(51) Int. Cl.[7] ............................................. H01L 29/00
(52) U.S. Cl. .................. 257/530; 257/50; 257/529; 438/131; 438/467; 438/600
(58) Field of Search ................ 257/50, 530, 410, 257/529, 532; 438/600, 131, 467, 957, 281, 333; 365/96, 225.7

(56) References Cited

U.S. PATENT DOCUMENTS

| | | | | |
|---|---|---|---|---|
| 4,543,594 A | * | 9/1985 | Mohsen et al. | 357/51 |
| 4,562,639 A | * | 1/1986 | McElroy | 29/584 |
| 4,881,114 A | * | 11/1989 | Mohsen et al. | 357/54 |
| 4,943,538 A | * | 7/1990 | Mohsen et al. | 437/52 |
| 5,057,451 A | * | 10/1991 | McCollum | 437/69 |
| 5,110,754 A | * | 5/1992 | Lowrey et al. | 437/52 |
| 5,635,873 A | * | 6/1997 | Thrower et al. | 330/253 |
| 5,742,555 A | * | 4/1998 | Marr et al. | 365/225.7 |

FOREIGN PATENT DOCUMENTS

EP 0495317 A1 * 7/1992

* cited by examiner

*Primary Examiner*—Steven Loke
*Assistant Examiner*—Donghee Kang (57) ABSTRACT

A programmable anti-fuse is formed simultaneously with transistors and other devices on a semiconductor substrate. Embodiments include an anti-fuse comprising a doped active region in the substrate, such as an n+ region, a gate oxide layer, and a gate, such as polysilicon, of a minimum size according to design rules. The anti-fuse is programmed by passing a current through it sufficient to cause its gate oxide layer to fail. The inventive anti-fuse is formed by simply altering the patterning of layers that need to be formed for other devices on the substrate. Therefore, it is formed without added manufacturing costs.

8 Claims, 8 Drawing Sheets

THIN OXIDE ANTI-FUSE

RELATED APPLICATIONS

This application claims priority from U.S. Provisional Patent Application Serial No. 60/161,910, filed on Oct. 28, 1999 entitled "Thin Oxide Anti-Fuse", the entire disclosure of which is hereby incorporated by reference therein.

FIELD OF THE INVENTION

The present invention relates to a semiconductor device formed on a semiconductor substrate. The invention has particular applicability in manufacturing semiconductor devices requiring one-time programmability.

BACKGROUND ART

Integrated circuit (IC) products require a capability of one time programmability. By serializing individual dies on a wafer for identification by a well-known one-time programming or "fuse programming" technique, and storing this data in an information data base, yield can be improved because the manufacturer can trace where a particular chip originated. For example, after the chip is in service, it can be traced to a lot, etc. Furthermore, after wafer processing is completed, wafers are subjected to a "wafer sort" where the dies are tested before being packaged. Generally, yield may be as low as 50%, and since packaging is costly, the manufacturer prefers to avoid packaging defective devices. Therefore, the dies are tested in wafer form. If information about the wafer is known because the dies were serialized with fuse programming, the manufacturer thereby knows that the dies are associated with a particular wafer and/or a particular position on the wafer (e.g., on the edge or in the middle of the wafer). This information facilitates the diagnosis of processing problems. For example, a yield map can be produced that will point out defect patterns which can then be traced to a particular process or piece of processing equipment.

One-time programmability has been done in prior art by three basic approaches:

1. An array of fuse links that may be "blown open." An unblown fuse has a low resistance and a blown fuse has a high resistance, usually at the level of a functional open circuit.

2. An anti-fuse that may be "blown shorted." An unblown anti-fuse has a high resistance, often functionally an open circuit. A blown anti-fuse has a low resistance, usually a resistance value less than 1000 ohms.

3. A programmable transistor with a floating gate. These are devices such as EPROMS, EEPROMS and flash memories.

The general trend in high-speed logic technologies has been towards a reduction in power supply voltages, with IC's currently being produced with 2.0 volts and less operating voltage. The maximum voltage capability of these transistors is often well under 10 volts. Disadvantageously, conventional fuse links require a potential of greater than 10 volts at currents greater than 10 amperes for reliable fuse blowing. Likewise, conventional amorphous polysilicon anti-fuses also require greater than 10 volts at currents greater than 100 µA for reliable fuse blowing. Therefore, using basic logic transistors to blow fuses is impractical. Furthermore, although programmed fuse links require less current to blow, the required programming voltage is still too high to use basic logic transistors for anti-fuse blowing.

Thus, for both fuse or anti-fuse programming, fuse devices having a higher than standard voltage breakdown capability are required. Forming such non-standard devices adds cost and complexity to the integrated circuit process and wafer cost. Likewise, to embed programmable transistors, such as flash memory cells, into a logic device also adds cost and complexity to the integrated circuit, even more than simply adding high voltage transistors as fuses or anti-fuses. Unless the IC needs megabits of programmable sites, this approach is not cost effective. IC's commonly need only a modest amount of bits to be one-time programmable, anywhere from a few bits to several kilobits.

There exists a need for a one-time programming capability that does not unduly add to the cost of manufacturing the semiconductor device.

SUMMARY OF THE INVENTION

An advantage of the present invention is a method of providing one-time programming capability without added manufacturing costs.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by an anti-fuse of a semiconductor device, the anti-fuse comprising an active region in a semiconductor substrate; a channel region adjacent to the active region in the substrate; a gate oxide layer on a main surface of the substrate above the channel region; and a conductive gate on the gate oxide layer, the gate having about a minimum dimension according to the design rules of the semiconductor device; wherein the gate, channel region and active region are arranged such that the gate oxide fails when a programming voltage is applied between the gate and the active region.

Another aspect of the present invention is a method for providing one-time programmability for a semiconductor device formed on a semiconductor substrate, the method comprising providing an anti-fuse by forming an active region in the semiconductor substrate, a channel region adjacent to the active region in the substrate, a gate oxide layer on a main surface of the substrate above the channel region, and a conductive gate on the gate oxide layer; and applying a programming voltage between the gate and the active region to cause the gate oxide to fail.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for providing one-time programming for semiconductor devices require the formation of additional, specialized devices on the substrate, thus adding cost and complexity to the manufacturing process. The present invention addresses and solves these problems stemming from conventional complex manufacturing processes.

According to the methodology of the present invention, a programmable anti-fuse is formed simultaneously with transistors and other devices on a semiconductor substrate. Thus, the anti-fuse is formed without additional process steps. As used throughout the present disclosure and claims, the term "substrate" denotes a semiconductor substrate or an epitaxial layer formed on the semiconductor substrate. In one embodiment of the present invention, an anti-fuse comprises a doped active region in the substrate, such as an n+ region, a gate oxide layer, and a gate, such as polysilicon, of a minimum size according to design rules. The anti-fuse is programmed by passing a current through it sufficient to cause its gate oxide layer to fail, or "blow". Moreover, since the inventive anti-fuse is formed by simply altering the patterning of layers which need to be formed for other devices on the substrate, it is, in essence, formed for free.

Furthermore, because the inventive anti-fuse is formed using the typically very thin gate oxide of the other metal oxide semiconductor (MOS) devices on the substrate, such as a 50 A thick gate oxide, the anti-fuse of the present invention is programmed using very low voltage (e.g., significantly less than 10 volts), and can be as small as a minimum-size transistor according to the design rules of the semiconductor device. Thus, the inventive anti-fuse consumes less valuable "real estate" on the substrate than conventional anti-fuses. Still further, the low power requirements of the inventive anti-fuse enables the use of minimum size drivers (i.e., power transistors) to program it, thereby further reducing the amount of required chip space.

Anti-fuses according to the present invention can be formed as an array of anti-fuses with as many fuses in the array as necessary, e.g., to identify the die. An array of the inventive anti-fuses can also be used as a one-time programmable memory device.

For many years, engineers and scientists have worked to improve gate oxide reliability on MOS transistors, developing knowledge of making reliable gate oxide. Likewise, much is known about the failure modes of gate oxide. Flowing current through a gate oxide (or oxide-nitride-oxide, or silicon oxynitride, etc.) at the rate of 1 amp/cm$^2$ will always result in shorting the gate oxide and thus causing it to fail. However, for an anti-fuse, this short-circuit is a "success". For example, a small gate oxide structure, e.g. 0.3$\mu$×0.3$\mu$, has an active area of about 0.09 $\mu^2$ or, since 1$\mu^2$=10$^{-8}$ cm$^2$, an active area of 9×10$^{-10}$ cm$^2$. Thus, a sustained current of about 1 $\mu$A will cause the oxide to fail, and if this current is higher, it will fail (or "program") faster. The "failure" in this case is intentional and, therefore, successful in programming the anti-fuse. The transistor drive current is typically greater than 500 $\mu$A/$\mu$ of drawn width, so even the smallest transistor possible can generate more than enough current to program a thin oxide anti-fuse. The resistance of these shorted devices is about 1000 ohms, quite low resistance for an extremely small device.

The voltage required for the inventive anti-fuse programming is on the order of 10 $\mu$V/cm to 15 $\mu$V/cm for a typical gate oxide thickness. For example, for a 50 Å thick gate oxide layer, a programming voltage of 10 $\mu$V/cm requires 5.0 volts to be supplied to blow the anti-fuse, much lower voltage than conventional fuse-links or amorphous polysilicon anti-fuses. MOS transistor voltage breakdown on the drain terminal is largely determined by the gate, the gate oxide thickness, and the consequent high electric field at the gate edge/drain diode. This is commonly called gated diode breakdown voltage. Depending on "drain engineering", gate diode breakdown is typically about 10 $\mu$V/cm, and scales along with gate oxide thickness.

Figure 1A:
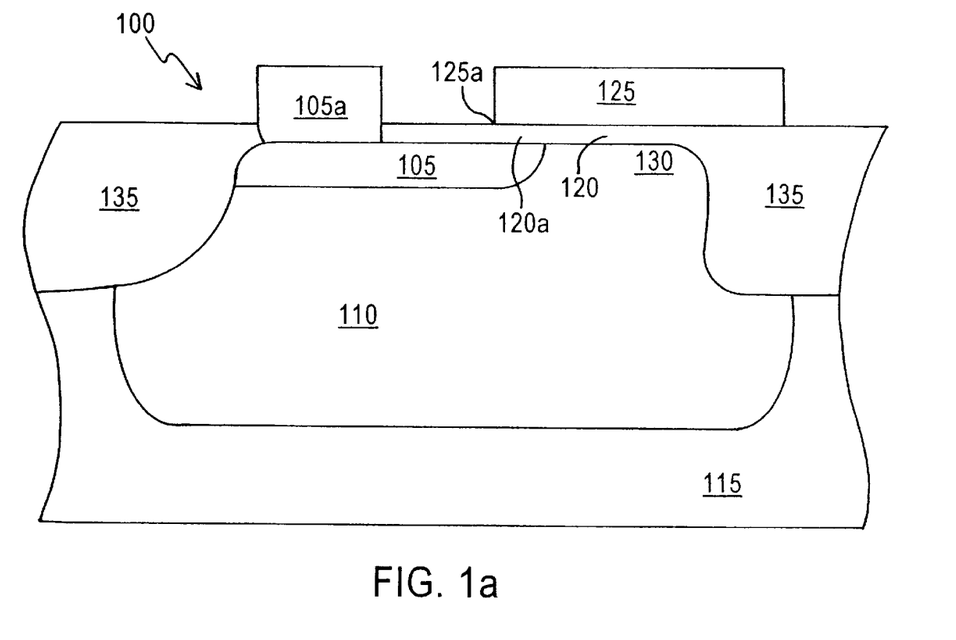
FIGS. 1a–1d schematically illustrate anti-fuses according to an embodiment of the present invention.
Figure 1B:
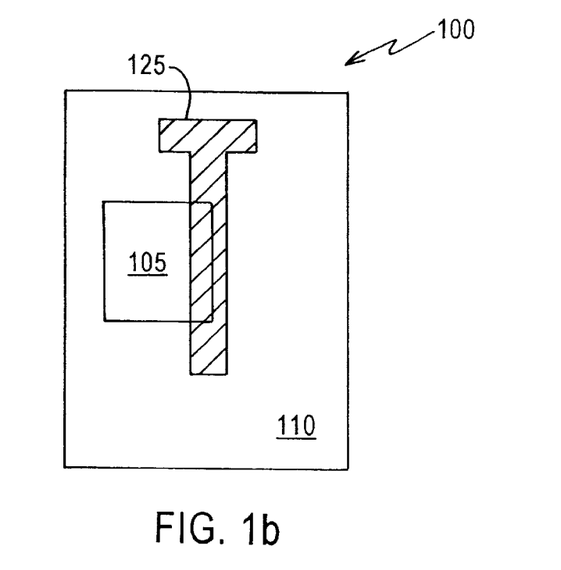
Figure 1C:
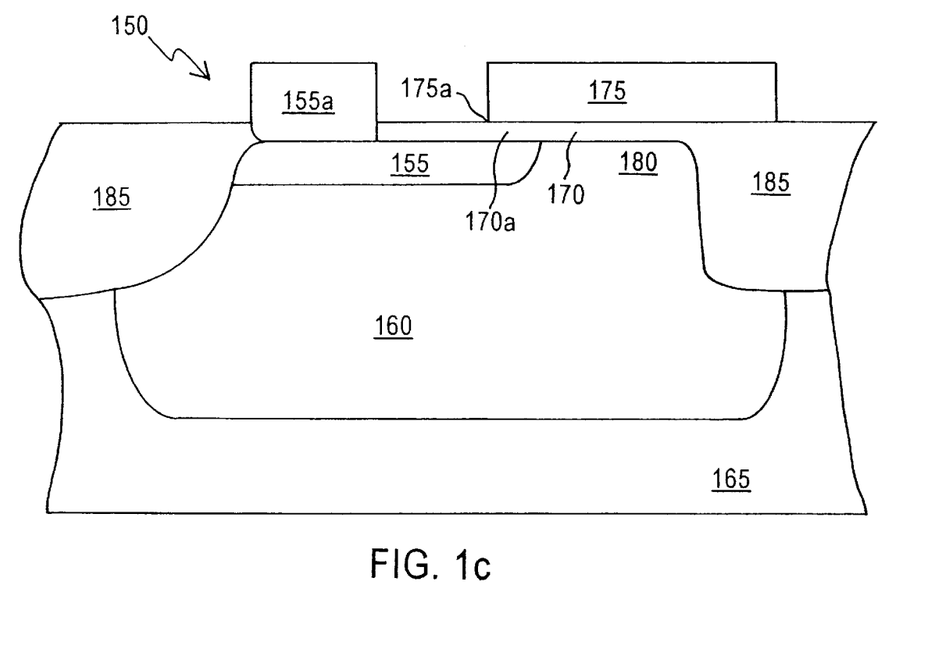
Figure 1D:
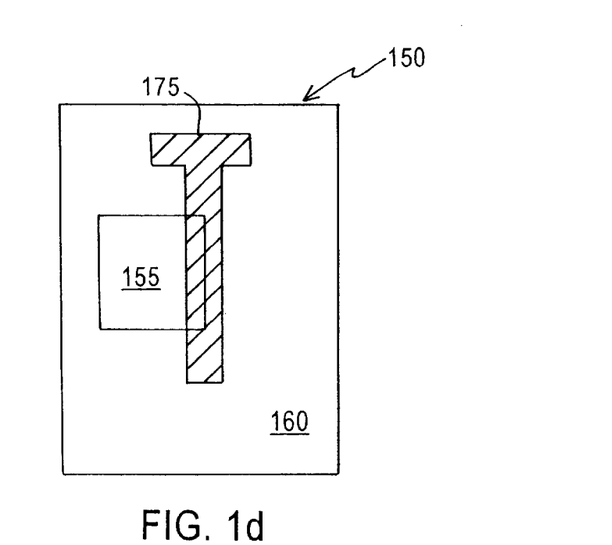

Anti-fuses according to an embodiment of the present invention are shown in FIGS. 1a–1d, wherein FIGS. 1a and 1b are cross-sectional and top views, respectively, of an n-type anti-fuse 100, and FIGS. 1c and 1d are cross-sectional and top views, respectively, of a p-type anti-fuse 150. Anti-fuses 100, 150 comprise heavily doped diffusions of the same type as the background; e.g., an n+ doped active region 105 in an n-well 110 of an n or p substrate 115 (or simply an n+ region in an n substrate), or a p+ doped active region 155 in a p-well 160 of an n or p substrate 165 (or simply a p+ region in a p substrate). A thin gate oxide 120, 170 having a thickness of about 50 Å or less (e.g., about 30 Å) is formed, as by thermal oxidation, on a main surface of substrate 115, 165. A conductive gate 125, 175, such as polysilicon or polycide, is then formed, as by deposition, masking and etching of a layer of polysilicon, on gate oxide 120, 170. Gate 125, 175 preferably has a dimension (e.g., gate length) about equal to the minimum feature size according to the design rules of the semiconductor device, to minimize the program voltage necessary to blow anti-fuse 100, 150. A channel region 130, 180 is disposed adjacent to active region 105, 155 under gate 125, 175. Field oxide regions 135, 185, such as silicon dioxide formed by deposition, are disposed adjacent to active region 105, 155 and channel region 130, 180.

Since forming diffusions on both sides of gate 125, 175 serves no purpose, inventive antifuse 100, 150 will look like half of a transistor from a topographical viewpoint. However, it will not be a transistor; it will be a capacitor, wherein channel 130, 180 forms when a voltage is placed between gate 125, 175 and heavily doped active region 105, 155.

A portion of active region 105, 155 extends under an edge 125a, 175a of gate 125, 175. The simple capacitor anti-fuse 100, 150 of this embodiment provides high electric field strength, especially where the n+ or p+ diffusions of active region 105, 155 extend under the edge 125a, 175a of gate 125, 175. Since gate/diffusion edge 125a, 175a is the most likely spot for the anti-fuse to program (i.e., for gate oxide 120, 170 to be blown), it also will result in the least gate polysilicon/diffusion resistance once programmed.

In other words, the actual gate oxide anti-fuse is the thin gate oxide portion 120a, 170a between the gate and the underlying diffusions. Anti-fuse 100 of FIGS. 1a–b can be programmed to n-well 110, but because of the electric field strength, programming is most likely to occur into n-plus region 105 because of electric field fringing. The analogous situation will occur in anti-fuse 150 of FIGS. 1c–d.

The inventive anti-fuses such as anti-fuse 100 are formed simultaneously with other devices on the substrate, such as transistors. For example, gate oxide 120 of anti-fuse 100 is formed at the same time and to the same thickness as the gate oxide for the remainder of the devices formed on substrate 115. Gate 125 of anti-fuse 100 is formed on gate oxide 120 at the same time as the gates for other devices formed on substrate 115, but is typically has much smaller dimensions, as discussed above. Likewise, active region 105 is formed with the same ion implantation step used to form source/drain regions for other devices. Active region 105 is typically formed after gate 125 by ion implanting impurities using gate 125 as a mask, since this is how MOS transistors are typically formed. Thus, the inventive anti-fuse is formed without additional processing steps beyond those necessary to form the other MOS devices on the substrate. The inventive anti-fuse only requires for its formation changing the patterning of the layers already being formed.

To program anti-fuses 100, 150 of FIGS. 1a–d, about 5 volts is applied between gate 125, 175 and the active region contact 105a, 155a, and gate oxide 120, 170 will begin to draw current at about 5 millivolts per centimeter. If gate oxide 120, 170 is about 100 angstroms thick, tunneling begins about 6 millivolts per centimeters or 6 volts. Commonly, 30 angstrom gate oxides are employed, in which case tunnelling will begin to occur at about 1.8 volts to about 2 volts. Somewhere between 10 millivolts and 12 millivolts, the gate oxide will rapidly fail. Thus, rapid programming will occur between 12 and 15 millivolts, as high amounts of current flux causes gate oxide 120, 170 to heat up, melt and finally fail.

In one embodiment of the present invention, the breakdown voltage is raised by about 70% by connecting two MOS devices in a well-known cascode configuration and biasing the upper gate at about half the intended breakdown voltage. So, if gate diode breakdown voltage with a 50 Å gate oxide results in a single transistor drain breakdown voltage of 5 volts @ 10 $\mu$V/cm, then a cascode can be expected to provide an 8.5V breakdown with the consequent capability of applying up to 17 $\mu$V/cm on a 50 Å gate oxide anti-fuse. Moreover, as gate oxide is scaled below 50 Å to, for example, about 25 Å, the cascode breakdown voltage capability will scale with it. Furthermore, since the applied voltage on the driver transistor during the one-time programming is in the seconds to milliseconds range, transistor reliability hazard is only limited to this short duration of programming.

Figure 2A:
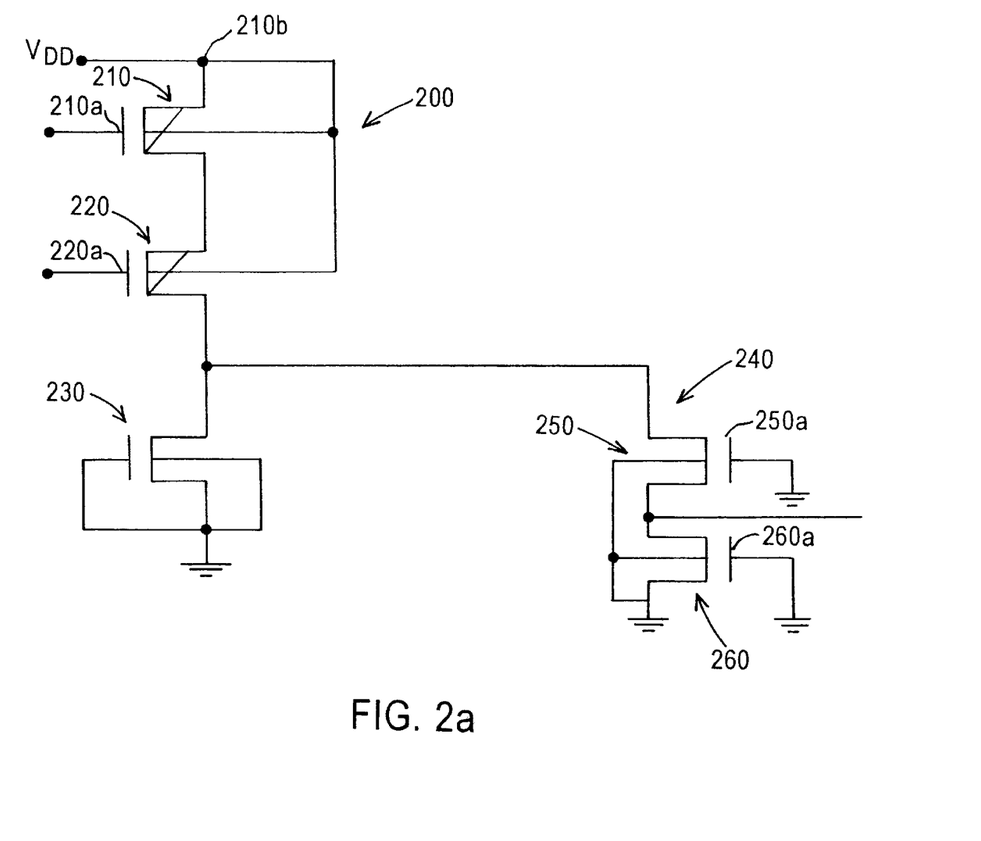
FIGS. 2a–2b schematically illustrate anti-fuse program and read circuitry in accordance with the present invention.
Figure 2B:
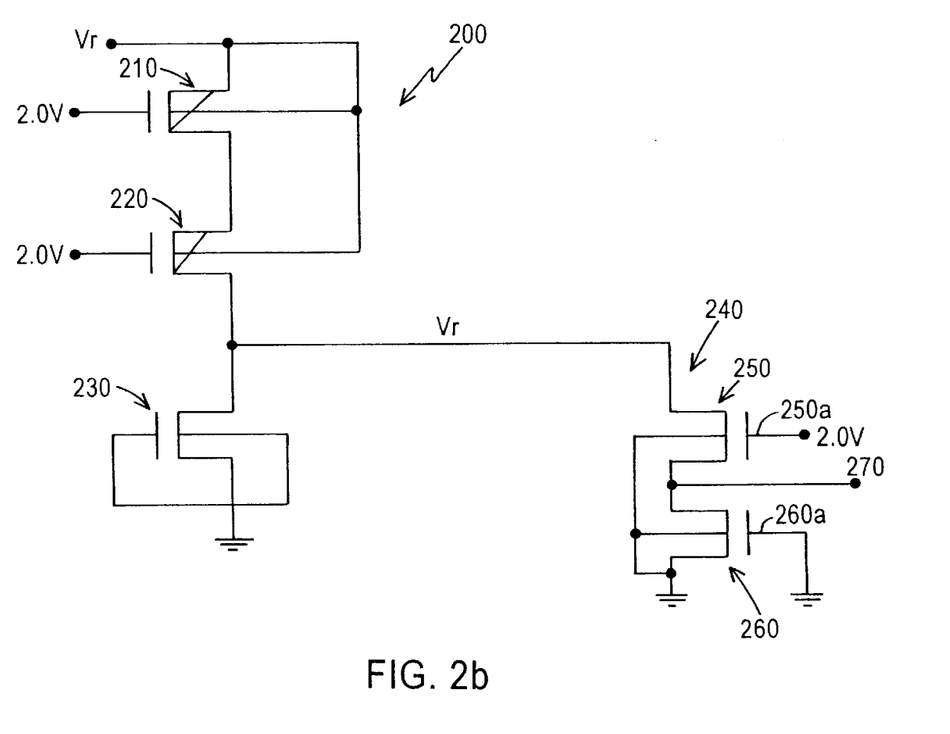

Program and read circuitry for the inventive anti-fuses is shown in FIGS. 2a and 2b, wherein a cascode technique is utilized to mitigate the stress on the driver transistors by enabling the programming voltage load to be applied to an anti-fuse 230 to be shared between two program cascode transistors 210, 220 of a program cascode 200, and to enable the programmed anti-fuse to be read by a read cascode 240. To program the anti-fuses of the present invention, a temporary high voltage power source is needed. This can be supplied externally, or with a conventional on-chip charge-pump and a storage capacitor (not shown) much larger than the anti-fuse being programmed.

If a normal operating voltage of 2.0 volts is used for the semiconductor device, and the gate oxide thickness is about 50 Å, then about 8.5 volts is necessary for programming the inventive antifuse. Referring now to FIG. 2a, which illustrates anti-fuse programming according to an embodiment of the present invention, during programming each program cascode transistor 210, 220 of program cascode 200 handles about 4.25 volts, or half the programming voltage (Vdd) of about 8.5 volts which is applied to anti-fuse 230 to program it. Read cascode 240 is disabled by grounding control gates 250a, 260a of read cascode transistors 250, 260. To program anti-fuse 230, sufficient voltage is applied to control gate 210a of top cascode transistor 210 to turn it on (e.g., more than about 2 volts relative to its source 210b, such as about 6.5 volts or less), while applying about 4.25 volts to control gate 220a of bottom cascode transistor 220. On the other hand, if it is desired not to program anti-fuse 200, 8.5 volts is applied to top cascode transistor 210 with its source 210b grounded (i.e., tied to its gate 210a) to turn off transistor 210.

Referring now to FIG. 2b, in the read mode program cascode 200 (also called a "write cascode") is used to supply current to anti-fuse 230 and the resulting voltage $V_r$ (e.g., about 2 volts) is sensed by read cascode 240. If anti-fuse 230 is open (i.e., it was never programmed), voltage $V_r$ will be high. However, if anti-fuse 230 is shorted (i.e., if it has been programmed), voltage $V_r$ will be low. To sense voltage $V_r$, a sufficient voltage (e.g., about 2 volts) is applied to gate 250a to turn on upper read cascode transistor 250 to place potential $V_r$ on a read node 270 between read cascode transistors 250, 260. This signal is then fed to logic circuitry (not shown), such as 2 volt logic circuits.

An array of inventive anti-fuses (e.g. anti-fuse 200, 100 or 150) can be provided on a substrate, each one having read and program circuitry as shown in FIGS. 2a–b, typically with the read circuits tied together. Thus, after selectively programming the array of anti-fuses using, e.g., program cascode 200, all the read and program cascodes can be operated as shown in FIG. 2b so that the data from all the read nodes on the array is fed into the 2 volt logic circuitry, enabling the data stored in the anti-fuses to be recovered.

Figure 3A:
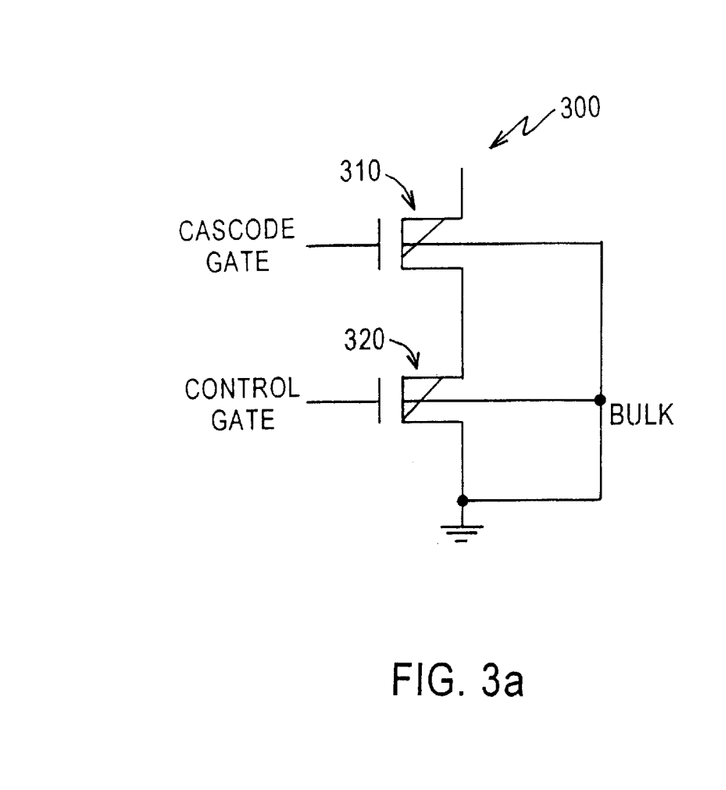
FIGS. 3a–c schematically illustrate drivers for anti-fuses.
Figure 3B:
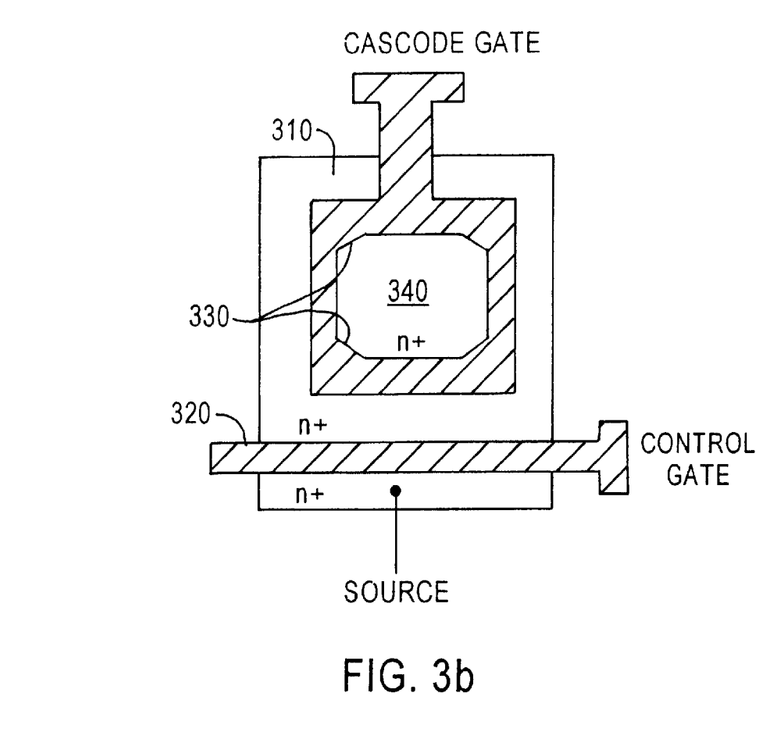

Transistors are typically designed to minimize and mitigate peak electric fields on gate oxide using "channel engineering". The reverse strategy is available for the thin oxide anti-fuse. For example, in designing a high voltage MOS cascode 300 having transistors 310, 320 as shown in FIG. 3a, it is well-known that best performance is achieved if the gate of upper cascode transistor 310 (called the "cascode gate") is enclosed in a "donut" to get rid of any parasitic field oxide transistor action. Such a gate arrangement is shown in FIG. 3b. With 45° chamfers 330 on the "donut-hole" drain diffusion 340, the sharp n+ drain corner electric field is mitigated and breakdown voltage is raised by typically about 10% in the device of FIG. 3b vs. that of FIG. 3c, which has square corners 350 on its drain diffusion 360. With the sharp n+ drain corners depicted in FIG. 3c, the thin gate oxide (not shown) of the transistor will fail at a lower voltage than the gate oxide of the device of FIG. 3b.

Figure 3C:
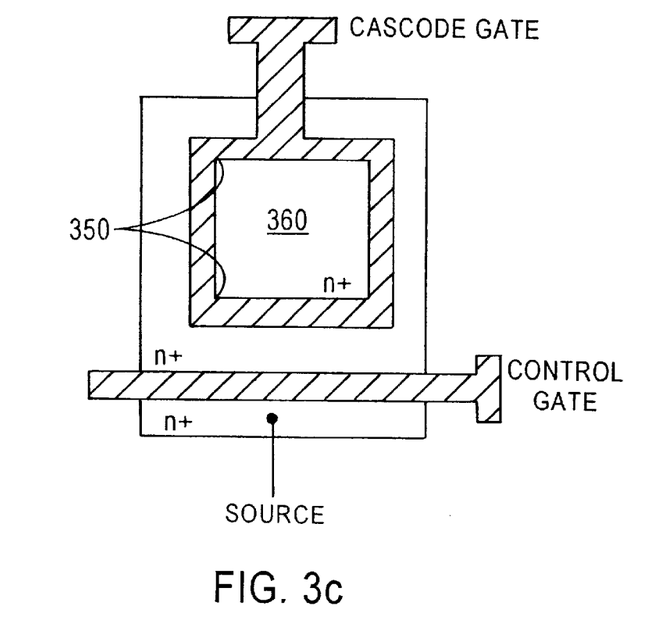
Figure 4:
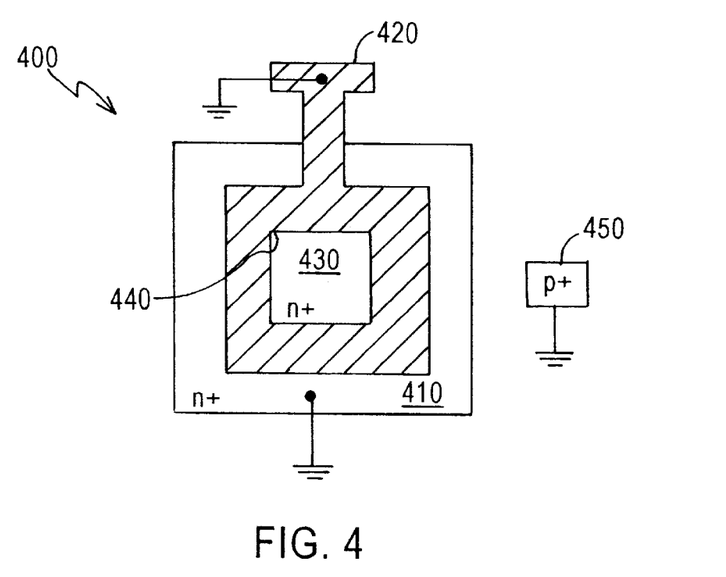
FIGS. 4, 5a–5b and 6a–6d schematically illustrate anti-fuses according to further embodiments of the present invention.

If the device of FIG. 3c is isolated (i.e., not in a cascode configuration), the result is the antifuse 400 of another embodiment of the present invention shown in FIG. 4. With its source 410, gate 420 and substrate 450 grounded while a voltage is applied to its drain 430, its gate oxide (not shown) can be easily blown with the breakdown voltage of cascode transistor 310 of FIG. 3b to program the device. The ultra-small corners 440 (e.g., effectively about $0.02\mu \times 0.02\mu$ each) provide an effective gate oxide area of $4 \times (0.02\mu \times 0.02\mu)$, or $0.0016\mu^2$. The arrangement of FIG. 3b may also be done with p-channel transistors, thus providing a complementary set of driver transistors for anti-fuse transistor 400.

Figure 5A:
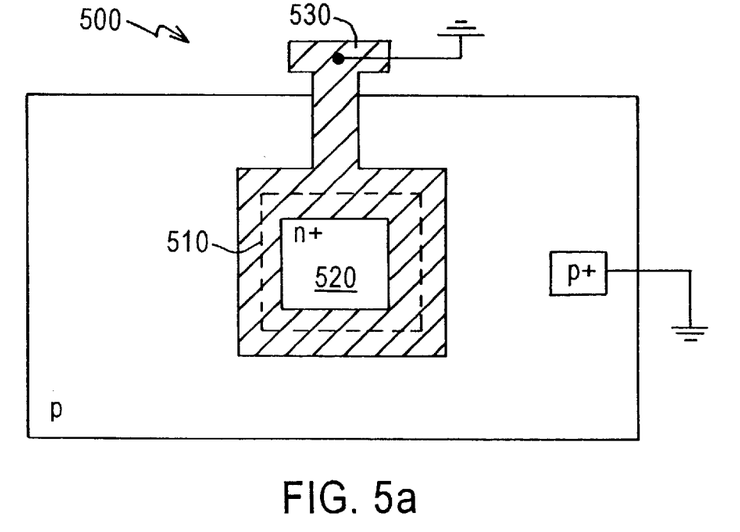
Figure 5B:
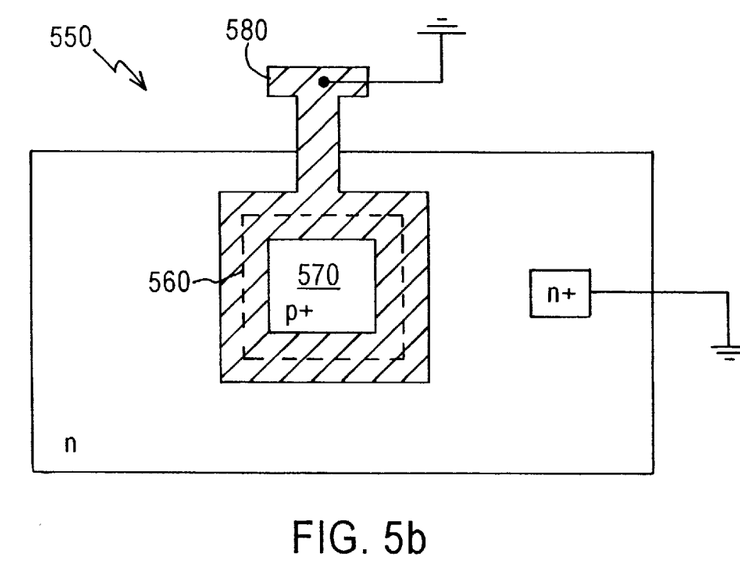

Since anti-fuse 400 is used as a gated diode rather than a transistor, it does not need a source terminal. Therefore, source region 410 can be omitted, as illustrated in FIGS. 5a and 5b. FIG. 5a shows an n+ gated diode/thin oxide anti-fuse 500 and FIG. 5b shows a p+ gated diode/thin oxide anti-fuse 550 according to further embodiments of the present invention. Gated diode anti-fuses 500, 500 feature an active region field oxide edge 510, 560 that allows active region 520, 570 to partially extend under the donut hole of gate 530, 580. These gate enclosed diode structures avoid parasitic effects of field transistors, and provide very high electric field gradients.

Figure 6A:
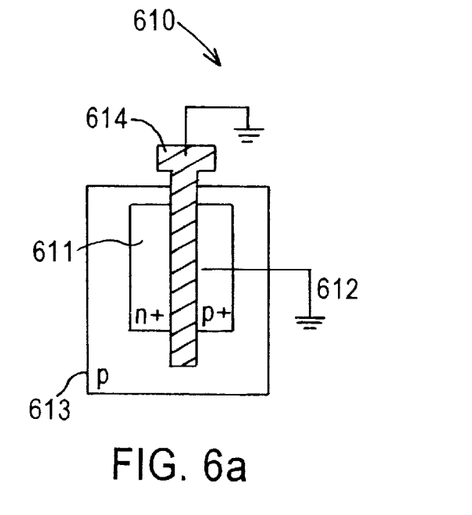
Figure 6B:
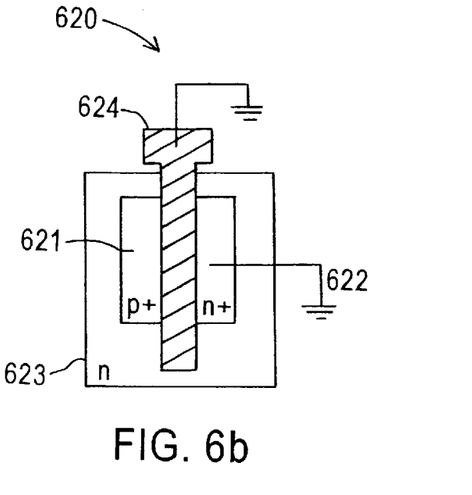

According to still further embodiments of the present invention, as shown in FIGS. 6a–6d, if parasitic field transistor effects are inconsequential, then smaller area gated diode anti-fuses 610, 620, 630 and 640 resembling transistors (i.e., having n+ region on one side of the gate and a p+ region on the other) can be employed. Referring now to FIG. 6a, anti-fuse 610 comprises an n+ drain region 611 and a p+ source region 612 formed in a p-well (or p substrate) 613 and separated by a channel region (not shown), and a gate 614 formed on the channel region. Gate 614 and source 612 are both grounded. Referring to FIG. 6b, anti-fuse 620 comprises a p+ drain region 621 and an n+ source region 622 formed in an n-well (or n substrate) 623 and separated by a channel region (not shown), and a gate 624 formed on the channel region. Gate 624 and source 622 are both grounded.

Figure 6C:
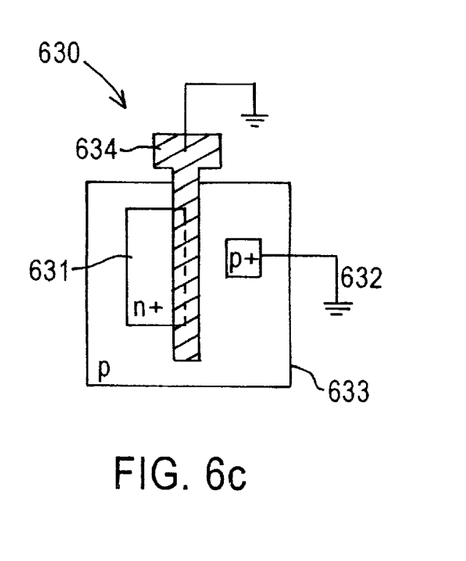
Figure 6D:
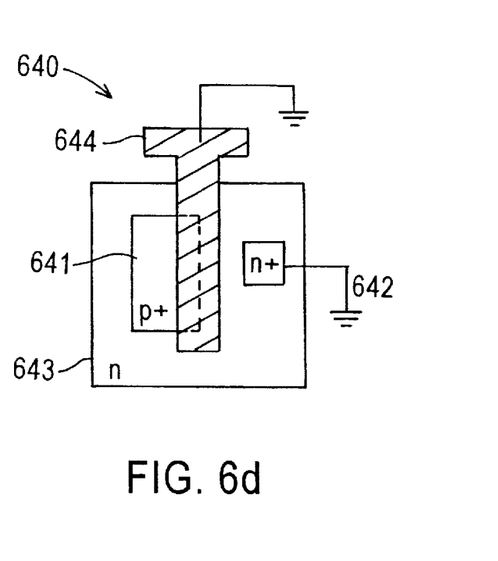

Referring now to FIG. 6c, anti-fuse 630 comprises an n+ drain region 631 and a much smaller p+ source region 632 formed in a p-well (or p substrate) 633, and a gate 634 formed above an edge of drain region 631 and above where it meets p-well 633. Gate 634 and source 632 are both grounded. Referring to FIG. 6d, anti-fuse 640 comprises a p+ drain region 641 and a much smaller n+ source region 642 formed in an n-well (or n substrate) 643, and a gate 644 formed above an edge of drain region 641 above where it meets n-well 643. Gate 644 and source 642 are both grounded.

Other topographical geometries can be used to form anti-fuses according to the present invention. Any poly/gate oxide/substrate (or well) combination can be used. Positive or negative polarities can be used for both programming and read functions. Step function programming pulses can be used or any type of voltage/current ramp/waveform programming can be used. Multiple pulse programming can also be used.

The present invention is applicable to the manufacture of various types of semiconductor devices, particularly high density semiconductor devices having a design rule of about 0.18μ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. An anti-fuse of a semiconductor device, the semiconductor device having design rules, the anti-fuse comprising:

an active region in a semiconductor substrate;

a channel region adjacent to the active region in the substrate;

a gate oxide layer on a main surface of the substrate above the channel region; and a conductive gate on the gate oxide layer, the gate having about a minimum dimension according to the design rules of the semiconductor device;

wherein the gate, channel region and active region are arranged such that the gate oxide fails when a programming voltage is applied between the gate and the active regions wherein the active region is of a first conductivity type, further comprising a second active region of a second conductivity type, wherein the second active region and the gate are electrically connected.

2. The anti-fuse of claim 1, wherein the active region and the channel region are located in a portion of the substrate having the same conductivity type as the active region.

3. The anti-fuse of claim 2, further comprising a first field oxide region adjacent to the active region, and a second field oxide region adjacent to the channel region.

4. The anti-fuse of claim 1, wherein the gate oxide has a thickness of 50 Å or less.

5. The anti-fuse of claim 1, wherein a portion of the active region extends under an edge of the gate, such that the gate oxide fails proximal to the gate edge when the programming voltage is applied.

6. The anti-fuse of claim 1, further comprising a plurality of transistors in the substrate arranged in a cascode configuration for supplying the programming voltage.

7. The anti-fuse of claim 6, further comprising a plurality of transistors in the substrate arranged in a cascode configuration for sensing when the gate oxide has failed.

8. An anti-fuse of a semiconductor device, the semiconductor device having design rules, the anti-fuse comprising:

an active region in a semiconductor substrate;

a channel region adjacent to the active region in the substrate;

a gate oxide layer on a main surface of the substrate above the channel region; and a conductive gate on the gate oxide layer, the gate having about a minimum dimension according to the design rules of the semiconductor device;

wherein the gate, channel region and active region are arranged such that the gate oxide fails when a programming voltage is applied between the gate and the active region;

wherein the gate comprises a donut-shaped portion having a substantially rectangular inner opening above the active region, the inner opening having substantially 90-degree corners.

* * * * *